United States Patent [19]

Gong et al.

[11] Patent Number: 5,318,800
[45] Date of Patent: Jun. 7, 1994

[54] METHOD OF FORMING HIGH TEMPERATURE THERMALLY STABLE MICRON METAL OXIDE COATINGS ON SUBSTRATES AND IMPROVED METAL OXIDE COATED PRODUCTS

[75] Inventors: Benmin Gong; James C. W. Chien, both of Amherst, Mass.

[73] Assignee: Academy of Applied Science

[21] Appl. No.: 997,118

[22] Filed: Dec. 24, 1992

Related U.S. Application Data

[63] Continuation of Ser. No. 693,431, Apr. 29, 1991, abandoned, which is a continuation-in-part of Ser. No. 407,912, Sep. 15, 1989, Pat. No. 5,024,894.

[51] Int. Cl.$^5$ .............................................. B05D 3/02
[52] U.S. Cl. ................................... 427/229; 427/346; 427/374.1; 427/376.2; 427/425; 427/241; 427/347

[58] Field of Search ............ 427/229, 346, 347, 374.1, 427/376.2, 425, 241

[56] References Cited

U.S. PATENT DOCUMENTS 4,303,554 12/1981 Sudo et al. ...................... 427/126.3

*Primary Examiner*—Michael Lusignan
*Assistant Examiner*—Benjamin L. Utech
*Attorney, Agent, or Firm*—Rines & Rines

[57] ABSTRACT

A method is disclosed of forming thin uniform micron range and submicron range aberration-resistant and hole-free high-temperature thermally stable metal oxide coatings upon metal, insulating and other substrates, involving the application of a polymer metal complex precursor solution to the substrate and appropriate firing for oxidation of the metal and the coating while burning off all traces of the polymer.

19 Claims, No Drawings

METHOD OF FORMING HIGH TEMPERATURE THERMALLY STABLE MICRON METAL OXIDE COATINGS ON SUBSTRATES AND IMPROVED METAL OXIDE COATED PRODUCTS

This application is a continuation of U.S. patent application Ser. No. 07/693,431, filed on Apr. 29, 1991 now abandoned, which is a continuation in part of U.S. patent application Ser. No. 07/407,912, filed on Sep. 15, 1989 now U.S. Pat. No. 5,024,894.

The present invention relates to methods of forming thermally stable metal oxide coatings upon substrates as of conducting, semiconducting and insulating surfaces; being more particularly directed to the formation of thin uniform and hole-free high temperature thermally stable metal oxide coatings for such purposes as (1) providing fractional to multi-micron insulating coating surfaces to conducting (and semiconducting) substrates and the like, including hard high-temperature thermally stable ceramic barrier coatings capable of resisting rust and other oxidation effects and acids, and having excellent hard wear characteristics; and (2) providing relatively conductive metal oxide coatings for insulating surfaces and the like.

BACKGROUND

In commonly assigned U.S. Pat. No. 5,024,894, there is disclosed a novel method of applying to semiconductor wafer surfaces and the like a coating of a polymer metal complex to form thereon a corresponding insulating barrier metal oxide thin layer adhered to the wafer surface and non-reactive therewith. The layer is formed by firing at elevated temperatures in an air atmosphere to result in a smooth continuous uniform insulating coating or layer well-adhered to the substrate. The use of a dimethylformamide solvent for a copolymer of methacrylic acid and/vinyl acetate was therein described as dissolving a metal salt, such as a nitrate of magnesium, lanthanum, strontium, and other metal salts to provide, as by spin coating, a coated solution upon the desired substrates—in that case, a semiconductor wafer surface. The resulting micron thick film of polymer metal complex precursor thus applied to the substrate was then heated under an air atmosphere from room temperature to about 700° C. for about 2 hours and then maintained at that temperature for another half hour, resulting in a smooth, continuous, pin-hole free insulating metal oxide layer of the order of 0.2 micron.

Such a technique has been found admirably suited to the coating of such semiconductor surfaces and the like as for buffer or similar purposes.

There are occasions, however, where the forming of similar high-temperature thermally stable metal oxide coatings on other types of substrates, including metal or other conducting substrate surfaces may be desired not only for some of the same reasons as described in said copending application, but also for very different functions and reasons. These include, for example, providing a hard and excellent wear-resistant coating, and/or a strongly insulating coating, and/or a high temperature thermally stable ceramic barrier, and/or for preventing rusting or other oxidation processes or attack by acids, while preventing the lifting of the coating that could otherwise permit attack of the substrate surface.

There are also instances where relatively conductive metal oxide coatings of uniform, pinhole free properties may be desired on insulating substrates, as of glass or the like, or on semiconducting substrates as in solar cell construction.

Underlying the present invention, indeed, is a discovery that rather critical modifications of the process described in said copending application may be instituted particularly to solve the above problems and it is to these purposes that the present invention is primarily directed.

OBJECTS OF INVENTION

An object of the invention, therefore, is to provide a new and improved method of forming thin uniform and aberration-resistant and hole-free high temperature thermally stable metal oxide coatings upon substrates, including metal and other conducting surfaces, semiconducting surfaces, as well as insulating surfaces, and to provide for control of the micron range thinness of the resulting metal oxide coating.

A further object is to provide such a novel coating method for such purposes as inhibiting rust or attack by acids or other elements upon metal and similar surfaces, providing a high temperature thermally stable ceramic barrier, providing a hard insulating thin micron range coating for conducting substrates, and/or providing a hard and excellent wear-resistant surface coating for various substrates.

Still an additional object is to provide novel coatings having the above-described properties that may be produced on a wide variety of substrate surfaces in accordance with the methodology underlying the invention.

Another object is to provide a method of producing a conducting metal oxide coating for insulating substrate surfaces, as of glass or the like, and novel coated products produced thereby.

Another object is to provide a method of producing a conducting metal oxide coating for semiconducting surfaces, as of silicon or the like and novel coated products produced thereby.

Other and further objects will be explained hereinafter and are more particularly delineated in the appended claims.

SUMMARY

In summary, however, from one of its important aspects, the invention embraces a method of forming thin uniform and aberration-resistant and hole-free high-temperature thermally stable metal oxide coatings upon a substrate, that comprises, dissolving a metal salt in a polymer solution to form a polymer-metal-complex precursor solution, containing ions of the metal, the oxide of which is desired as a coating on the substrate; coating the precursor solution after filtration upon the surface of the substrate and insuring uniformity of application over such surface; firing the coated substrate in an air or oxygen furnace to oxidize the said metal in the coating while burning off all traces of the polymer; and cooling the coated substrate to produce a hard, high temperature thermally stable metal oxide coating of submicron or micron range thinness adhered to the substrate surface.

Preferred and best mode formulations and details are hereinafter set forth, including novel coated products attainable by the technique of the invention.

DESCRIPTION OF INVENTION

As will be evident hereinafter, the invention provides an entirely different and less complex and costly technique for enabling the desired types of metal oxide coatings. Prior techniques have involved, for example, sputtering or chemical vapor deposition to deposit coatings having some of the properties above described.

Other techniques for applying wear-resistant surfaces or enameling for wire or other surface insulation, or anodizing metal surfaces to protect the same, all appear to be more complex and costly than the techniques of the present invention; and in any event, the invention is particularly suited to the deposit of fractional or micron-range thin coatings which cannot readily be attained by such prior techniques.

It is in order to describe the fabrication method underlying the invention by way of several examples of successful tests.

Turning first to metal oxide coatings for semiconductor surfaces, similar to those of said copending application, as for solar cell construction or the like, reference is made to the following example.

EXAMPLE 1

The before-described methacrylic acid-vinyl acetate copolymer was dissolved in N,N-dimethylformamide in the ratio of about fifty percent copolymer and fifty percent dimethylformamide. The resulting copolymer solution then received a metal salt in the form of indium nitrate penthahydrate in the proportion of 75% copolymer and 25% metal salt (weight percent) to form a polymer-metal-complex precursor solution wherein indium oxide was desired as the insulating coating on a semiconductive silicon substrate. The precursor solution was filtered with 0.4 micron filtering to remove foreign particles and then to enable spin coating on an acetone-cleaned silicon substrate surface. This resulted in a coating of about 2 microns thinness, as measured by interferometer measurements, producing uniformity over the surface. The coated substrate was then introduced into an air (or oxygen) oven with the temperature increased from room temperature to 400° C. for about 40 minutes, resulting in substantially complete burn-off of the polymer (commencing at about 300° C.), with no carbon or other polymer residue remaining, and with the indium metal oxidized as the coating on the silicon surface. The oxide coated substrate was then kept in the oven for another 10 to 20 minutes at substantially the same 400° C., resulting in an 0.2 micron thin indium oxide coating, strongly adhered to the substrate upon the cooling of the same. This coating was found to be totally aberration-resistant and hole-free and extremely uniform over the complete surface. Such uniformity, indeed, is demonstrated by the continuity of the characteristic blue color of such a thin film oxide coating, as viewed in daylight.

EXAMPLE 2

The experiment of Example 1 was repeated and the amount of indium nitrate compound relative to the amount of polymer solution was varied from the 25 grams of the metal salt and 75 grams of the copolymer of Example 1. It was noted that control of the concentration could be effected by increasing the amount of the copolymer, resulting in thinning of the coating.

Application of the technique of the invention to conducting substrates was also successfully implemented.

EXAMPLE 3

The relative proportions of Example 1 of metal oxide salt and the copolymer were repeated for zirconium acetyl acetonate with about 9% yittrium nitrate added, instead of indium nitrate pentahydrate. The same process was effected, this time on a conducting stainless steel plate, forming a 0.2 micron thick yittrium oxide-stabilized zirconium oxide film which was uniform and showed high-temperature thermally stable ceramic barrier properties.

EXAMPLE 4

The process and proportions set forth in Example 1 was repeated on a steel plate for an aluminum nitrate salt, producing an excellent insulating coating of aluminum oxide of the order of a few tenths of a micron.

The building up of this layer to the order of a micron and higher was then effected by recycling or repeating the steps of Example 1 (namely the spinning and heating) five times, each time adding 0.2 micron thickness to the coating.

EXAMPLE 5

The same process as in Example 1 was repeated on a steel plate with a chromium nitrate metal salt, producing a hard and excellent rust and wear-resistant 0.2 micron thick film of chromuim oxide.

EXAMPLE 6

The steps of Example 1 were also repeated for a titanium nitrate salt providing an excellent titanium dioxide film, again on a steel substrate.

Underlying all of the above examples is the generic concept of providing a polymer metal complex solution filtered as a clear liquid with no precipitates and then depositing it as a uniform coating over the surface-to-be-coated by spin coating, controlled dipping, or spraying. These steps are followed by heating to remove the polymer complex and solvent and oxidizing, resulting in a smooth and uniform, pure metal oxide film of the order of submicron thickness, which is free of pinholes and is aberration-resistant.

It has been observed, moreover, that the color of the coatings is distinctly related to the coating thickness, which not only enables verification of thickness and uniformity of coating, but also enables a selection of a desired color of the coating surface. It has been found that all metal oxides tested produce the same color for the same thickness; namely, at 1 micron thickness, the coating is clear and has no color; at 0.2 micron thickness, there is a blue tint; 0.3–0.4 micron thick films appear yellow; 0.6 micron, green; 0.5 micron, violet; and 0.8 micron, pink.

Further underlying the present invention, as previously stated, is the rather startling discovery that such metal oxides can, with a further modification of the method, be rendered substantially conducting, and well adapted for providing a conducting metal oxide coating on insulating substrates, such as glass or a ceramic, such as alumina, $ZrO_2$ or YSZ, a high temperature polymer, such as a polyimide or polysulfone and the like. The substrates may be flat surfaces, wafers or fibers such as glass or alumina fibers. This technique has been found to be effectable through the adding in the polymer metal complex precursor solution containing the dissolved metal salt, the oxide of which metal it is desired to use as the coating, an appropriate metal dopant salt that renders the metal oxide coating conductive.

EXAMPLE 7

A copolymer of methacrylic acid and vinyl acetate, both relatively low temperature decomposing polymers, was combined with a solvent of N-N-dimethylformamide in about equal proportions to provide a copolymer solution into which was dissolved a mixture of indium nitrate and a small amount of tin bromide dopant. The indium oxide-to-tin oxide ratio was about 10:1.

The resulting polymer metal complex precursor solution was spin coated upon the surface of a glass substrate, insuring uniformity of application over the whole surface, and the coated glass was then fired in an air or oxygen furnace at a temperature of about 400° C. for about 40 minutes, raising the temperature from about room temperature about 5° per minute. At about 300° C. the polymer substantially completely burned off with no residue, leaving the oxidized doped indium oxide. The glass coated element was then kept in the oven at the 400° C. temperature for about 10 to 20 minutes and then it was removed and cooled, providing a coating, that was found to be conducting, of about 91% indium oxide and 9% tin oxide.

EXAMPLE 8

The same technique of Example 7 was repeated with the process of coating and firing recycled five times, producing a one micron thick conducting indium oxide film.

EXAMPLE 9

3.6 g of indium nitrate pentahydrate and 0.379 g of tin (II) bromide (or alternatively, 0.25 g of tin (II) chloride) and 15 g of 1:1 vinyl acetate and methacrylic acid copolymer was co-dissolved, with the solution concentrated to a viscosity of 20–30 centipoise. This solution was applied to a glass substrate by spin-coating and then calcined in a furnace under flowing oxygen at 350°–400° C. for 10 minutes. A uniform film of $In_2O_3SnO_2$ of 0.2 to 0.3 microns thickness was formed without pinholes, and was highly conductive. Thicker films were produced by repeating the above process.

EXAMPLE 10

The process of Example 7 was repeated, but instead of spin-coating the glass, it was dip-coated again, producing a uniform, aberration-resistant and hole-free high temperature thermally stable conducting metal oxide coating of the order of 0.2 micron.

While the invention has been described in connection with spin coating, it has been verified in tests similar to Example 1, that, as before stated, the metal or other substrate surface may be dipped or sprayed with the polymer metal complex, again, however, ensuring uniformity of application over the entire surface. Instead of a coating, moreover, the polymer metal complex may, if desired, be drawn into a fiber or other shape as before stated.

The production of thin films of metal oxides and mixed metal oxides on substrates in accordance with the invention (using corresponding metal nitrates in the polymer-metal complex solutions), embraces metal oxides such as $Al_2O_3$, $TiO_2$, $ZrO_2$, MgO and $Cr_2O_3$; and mixed metal oxides such as $ZrO_2 \cdot Y_2O_3$ (YSZ), $SrTiO_3$, $LaAlO_3$, $In_2O_3 \cdot SnO_2$ and the metal oxide superconductors of said copending application. The polymer of the polymer metal complex precursors used in the methods of the invention, moreover, may, as explained in part in said copending application, be a carboxyl, amide, amic acid, ester, anhydride, nitrile or amine-containing homopolymer, copolymer or terpolymer or the like.

Further modifications will also occur to those skilled in this art, and such are considered to fall within the spirit and scope of the invention as defined in the appended claims.

What is claimed is:

1. A method of forming hole-free metal oxide coatings upon a substrate, that comprises, dissolving a metal salt in a polymer solution to form a polymer-metal-complex precursor solution containing the ions of the metal the oxide of which is to coat the substrate, said polymer-metal-complex comprising a polymeric acetate to promote adhesion to the substrate; filtering the precursor solution; coating the precursor solution after filtration upon the surface of the substrate and insuring uniformity of application over such surface by spinning; firing the coated substrate in an air or oxygen furnace to oxidize the metal in the coating while burning off all traces of the polymer; and cooling the coated substrate to produce a metal oxide coating of submicron or micron range thinness adhered to the substrate surface.

2. A method as claimed in claim 1 and in which the substrate is one of a conducting and semiconducting substrate.

3. A method as claimed in claim 1 and in which the substrate is a metal surface, and the metal oxide coating serves to provide one or more of insulation, wear surfacing, thermal barrier, and rust and other oxidation resistance.

4. A method as claimed in claim 1 and in which the amount of metal salt in the polymer-metal-complex solution is varied correspondingly to vary the thinness of the coating.

5. A method as claimed in claim 1 and in which the said polymer solution comprises methacrylic acid and vinyl acetate dissolved in dimethylformamide.

6. A method as claimed in claim 5 and in which the metal salt is selected from the group consisting of titanium nitrate, zirconium acetylacetonate, aluminum nitrate, indium nitrate, magnesium nitrate and chromium nitrate, to produce respective oxide coatings of Ti, Zr, Al, In, Mg and Cr.

7. A method as claimed in claim 5 and in which the dimethylformamide is approximately 50% of the weight of the polymer solution.

8. A method as claimed in claim 7 and in which the metal salt is about 25% of the weight of the polymer-metal- complex precursor.

9. A method as claimed in claim 5 and in which the firing is effected at about 400° C. for about 40 minutes, followed by continuing heating at about 400° C. for about 10–20 minutes, resulting in a coating of about $0.2\mu$.

10. A method as claimed in claim 9 and in which the coating and firing process is repeated to increase the coating thickness.

11. A method as claimed in claim 1 and in which the polymer solution comprises polymethacrylic acid.

12. A method as claimed in claim 1 and in which the polymer is selected from the group consisting of carboxyl, amid., amic acid, ester, anhydride, nitrile and, amine-containing polymers.

13. A method as claimed in claim 1 and in which a metal dopant salt is mixed in the said polymer solution to produce with the metal oxide coating an oxide of the metal dopant that renders the coating conductive.

14. A method as claimed in claim 13 and in which the polymer solution comprises copolymers of methacrylic acid and vinyl acetate dissolved in N, N-dimethylformamide.

15. A method as claimed in claim 13 and in which the metal salt is an indium salt and the dopant salt is a tin salt.

16. A method as claimed in claim 15 and in which the indium salt is indium nitrate pentahydrate and the tin salt is one of tine bromide and tin chloride.

17. A method as claimed in claim 16 and in which the indium-to-tin salt weight ratio is about 10:1.

18. A method as claimed in claim 13 and in which the substrate is an insulating surface.

19. A method as claimed in claim 1 and in which the said polymer solution is concentrated to a viscosity of about 20–30 centipoise.

* * * * *